United States Patent
McGaughey (10) Patent No.: US 8,494,706 B2
(45) Date of Patent: Jul. 23, 2013

(54) ELECTRIC FUEL PUMP TESTER AND METHOD

(75) Inventor: Robert J. McGaughey, Bringhurst, IN (US)

(73) Assignee: Federal-Mogul Corporation

( * ) Notice: Subject to any disclaimer, the term of this patent is extended or adjusted under 35 U.S.C. 154(b) by 157 days.

(21) Appl. No.: 13/213,587

(22) Filed: Aug. 19, 2011

(65) Prior Publication Data
US 2013/0046436 A1 Feb. 21, 2013

(51) Int. Cl.
G07C 11/00 (2006.01)
B60K 25/02 (2006.01)
F02D 41/222 (2006.01)
G01R 31/007 (2006.01)
G01R 31/006 (2006.01)

(52) U.S. Cl.
USPC ........ 701/29.1; 701/33.5; 701/114; 701/33.9; 324/503

(58) Field of Classification Search
USPC .......................................... 701/29, 33.5, 33.9
See application file for complete search history.

(56) References Cited

U.S. PATENT DOCUMENTS

| | | | |
|---|---|---|---|
| 3,646,438 A | 2/1972 | Staff | |
| 3,871,797 A * | 3/1975 | Igarashi et al. | 417/423.3 |
| 4,207,611 A | 6/1980 | Gordon | |
| 4,333,338 A | 6/1982 | Patey | |
| 4,567,756 A | 2/1986 | Colborn | |
| 4,764,727 A * | 8/1988 | McConchie, Sr. | 324/503 |
| 4,859,953 A | 8/1989 | Young et al. | |
| 4,884,033 A * | 11/1989 | McConchie, Sr. | 324/503 |
| 5,066,919 A | 11/1991 | Klassen et al. | |
| 5,446,389 A | 8/1995 | Lenz | |
| 5,459,664 A | 10/1995 | Buckalew | |
| 5,461,908 A * | 10/1995 | Armstrong | 73/114.61 |
| 5,499,538 A | 3/1996 | Glidewell et al. | |

(Continued)

FOREIGN PATENT DOCUMENTS

EP 0039122 A2 11/1981
JP 2004138437 A 5/2004

OTHER PUBLICATIONS http://www.usmotorworks.com/Prod_ElectricFuelPump_tester.php.*

(Continued)

*Primary Examiner* — Fadey Jabr
*Assistant Examiner* — Yazan A Soofi
(74) *Attorney, Agent, or Firm* — Robert L. Stearns; Dickinson Wright, PLLC (57) ABSTRACT

The system and method for determining the operational condition of an electric fuel pump (16). The test apparatus (22) is configured to perform first, second and third tests. During the first test, a low voltage, low current signal is applied to produce an inductive reflectance from the pump armature winding. During the second test, continuity is assessed in the coil winding circuit. During the third test, a higher power, short duration pulse is applied to create rotational movement of the pump armature for the purpose of detecting mechanical and/or electrical issues not otherwise discerned from the prior tests. An optional fourth test may be conducted in which the pump (16) is run for a short period of time at standard operating power to generate a current waveform. Collected test data is compared to stored reference data sets using a processor contained within the test apparatus (22). If collected test data corresponds within an acceptable threshold range to the reference data, a PASS signal is generated.

20 Claims, 7 Drawing Sheets

U.S. PATENT DOCUMENTS

| | | | |
|---|---|---|---|
| 5,602,482 | A | 2/1997 | Gutierrez |
| 5,612,629 | A * | 3/1997 | Mullin et al. ............ 324/765.01 |
| 5,852,796 | A | 12/1998 | Stepanenko, Jr. |
| 5,875,413 | A | 2/1999 | Vinci |
| 5,903,156 | A | 5/1999 | Matsumaru et al. |
| 5,935,180 | A | 8/1999 | Fieramosca et al. |
| 6,043,661 | A | 3/2000 | Gutierrez |
| 6,055,468 | A | 4/2000 | Kaman et al. |
| 6,134,488 | A | 10/2000 | Sasaki et al. |
| 6,222,374 | B1 | 4/2001 | Shoemaker |
| 6,237,400 | B1 | 5/2001 | Takakura et al. |
| 6,323,656 | B2 | 11/2001 | Shoemaker |
| 6,466,025 | B1 * | 10/2002 | Klang ......................... 324/429 |
| 6,901,791 | B1 | 6/2005 | Frenz |
| 6,941,785 | B2 | 9/2005 | Haynes |
| 7,057,394 | B1 | 6/2006 | Bell et al. |
| 7,120,563 | B2 | 10/2006 | Bechhoefer et al. |
| 7,523,652 | B2 | 4/2009 | Baker et al. |
| 7,523,745 | B2 | 4/2009 | Troxler et al. |
| 7,710,121 | B2 * | 5/2010 | Harvey et al. ................ 324/503 |
| 2001/0002107 | A1 * | 5/2001 | Shoemaker ................... 324/765 |
| 2003/0014179 | A1 * | 1/2003 | Szukala et al. ............... 701/114 |
| 2004/0145838 | A1 * | 7/2004 | Hazelton ......................... 361/23 |
| 2004/0230384 | A1 * | 11/2004 | Haynes et al. ................. 702/57 |
| 2005/0052186 | A1 | 3/2005 | Grube |
| 2009/0178475 | A1 * | 7/2009 | Baker et al. ................ 73/114.41 |

OTHER PUBLICATIONS

Carter Fuel Delivery Products, The CV1000 Circuit Verifier Diagnostic Tool, http://www.carterfuelDelivery.com/fuelpumps/cv1000/index.php.

* cited by examiner

ELECTRIC FUEL PUMP TESTER AND METHOD

CROSS REFERENCE TO RELATED APPLICATIONS

None.

BACKGROUND OF THE INVENTION

1. Field of the Invention

This invention relates generally to method for fault detecting in electric components located in vehicle circuits and, more particularly, to a tester device and testing method for testing the electrical operating characteristics of an electric fuel pump.

2. Related Art

When a vehicle's fuel system is malfunctioning, the electric fuel pump is often considered first to determine whether it is defective. A common issue encountered when attempting to diagnose a problem with a vehicle's fuel system is that the technician is unable to quickly yet thoroughly test the electric fuel pump so as to either identify it as the problem or to rule it out. According to most prior art techniques, a technician would test the voltage at the fuel pump electrical connection on the vehicle wire harness. In some cases, this was accompanied by the laborious process of uninstalling the fuel pump from the vehicle. If the voltage at the electrical connection measured within an acceptable range of the standard operating voltage of the electrical fuel pump (commonly 12 VDC), the technician would conclude that the electrical system of the vehicle was operating properly and, that the fuel pump was defective. This conclusion commonly dictated replacing the fuel pump, and possibly returning the original fuel pump to its manufacturer seeking reimbursement as a defect.

This approach often lead to an erroneous conclusion concerning the operability of the fuel pump. For example, if the fuel pump wire harness was defective, the simple voltage test might still register 12 VDC when in an unloaded state. In many reported cases, technicians using this simple voltage test have mistakenly replaced the fuel pump in a vehicle multiple times without realizing that the fuel pumps were never defective but instead the electrical system of the vehicle was the root cause of the problem. In each of these instances, substantial additional cost and inconvenience is caused to the vehicle owner, pump manufacturer and/or service technician due to the misdiagnosis.

A more recent prior art system and method for in situ testing the electrical operation of an electric fuel pump is shown in U.S. Pat. No. 7,710,121 to Harvey et al., issued May 4, 2010 and assigned to the assignee of the present invention. The entire disclosure of U.S. Pat. No. 7,710,121 is hereby incorporated by reference and relied upon. The system and method described in U.S. Pat. No. 7,710,121 represents a significant advancement over earlier systems and methods, and has enjoyed rapid and widespread acceptance in the marketplace. There exists however, a continuous desire for further improvement to provide even more easy to use, more efficient systems and methods for field testing the electrical operation of an electric fuel pump.

SUMMARY OF THE INVENTION

The present invention relates to a system and method for fault detecting in electric components located in vehicle circuits, and more particularly for testing the operation of an electric fuel pump. An electric fuel pump is provided having a power supply connection for electrically connecting the fuel pump to a vehicular fuel system. The fuel pump includes a motor having a commutator, a pump armature winding interfacing with the commutator, and a coil winding circuit. A test apparatus is provided having a processor and a non-transitory computer readable medium. Reference data is stored in the non-transitory computer readable medium. The test apparatus is electrically connected to the power supply connection of the fuel pump. The non-transitory computer readable medium is coded with instructions and executed by the processor to perform the steps of: conducting a first test, the first test including applying a low current signal through the fuel pump power supply connection and monitoring for inductive reflectance from the pump armature winding in the fuel pump; collecting data from the first test in the non-transitory computer readable medium; conducting a second continuity test, the second test including checking for an open or shorted coil winding circuit in the fuel pump; collecting data from the second test in the non-transitory computer readable medium; comparing the collected test data to the stored reference data; and generating either a humanly discernable FAIL or PASS signal in response to the comparing step.

The present invention is capable of being field implemented as a small, light test unit that will quickly discern whether an electric fuel pump is defective. The present invention can be used to provide a preliminary assessment on fuel pump functionality. In other words, the present invention provides a quick, initial test device and method for determining that the pump is functioning properly or, in the alternative, whether further testing is required. Use of the invention in the trade will result in more accurate diagnosis of vehicular fuel system problems, and fewer erroneous returns of electrical fuel pumps to their manufacturers.

BRIEF DESCRIPTION OF THE DRAWINGS

These and other features and advantages of the present invention will become more readily appreciated when considered in connection with the following detailed description and appended drawings, wherein.

DETAILED DESCRIPTION OF THE PREFERRED EMBODIMENT

Referring to the figures, wherein like numerals indicate like or corresponding parts throughout the several views, the present invention provides a system and method for testing the real-life electrical operating characteristics of a vehicle's fuel pump. A portion of a vehicular fuel system is generally shown at 10 in FIG. 1. In this example, the fuel system 10 includes a tank assembly 12 of the type commonly used for containing liquid fuel, such as gasoline, and then supplying that fuel upon demand to an internal combustion engine (not shown). The tank assembly 12 in this example comprises a thin-walled, hollow member into which liquid fuel is filled through a nozzle 14. An electric fuel pump module, generally indicated at 16, is disposed in the tank. This example depicts the fuel pump 16 as an in-tank type combined within a module assembly including a float, filter and other features. However, the principles of this invention can be applied equally to stand-alone fuel pumps, externally mounted fuel pumps and related devices.

Figure 1:
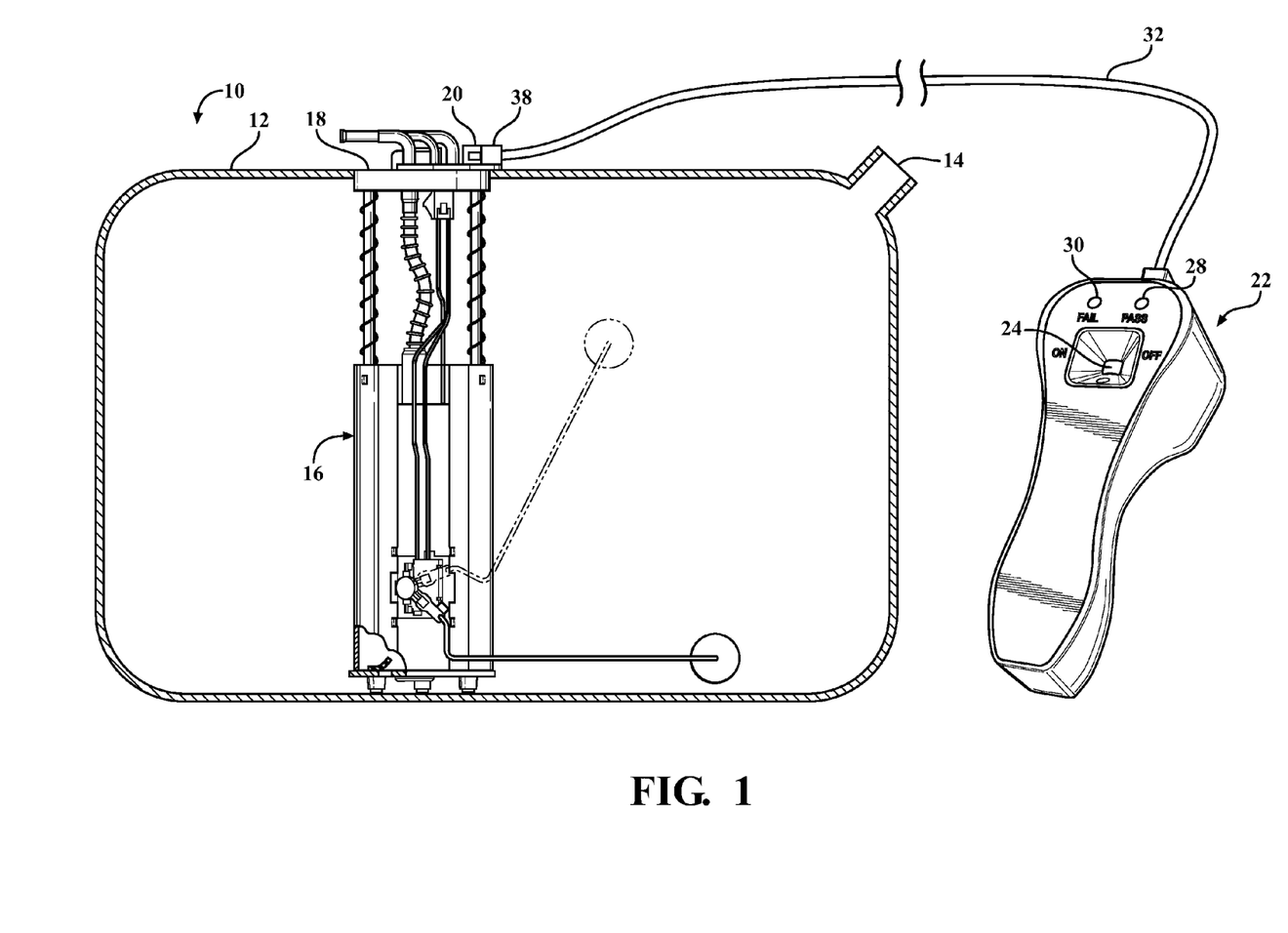
FIG. 1 is a schematic of an electric fuel pump tester according to one embodiment of the present invention connected to an electric fuel pump located inside a vehicular fuel tank for in situ testing.

The fuel pump 16 in the in-tank style shown includes a hanger flange 18 which seats in a complementary-shaped opening in the top of the tank 12. The hanger flange 18 acts as a lid, connecting the fuel pump 16 to the tank 12 and also routing fluids into and out of the tank 12, such as fuel and vented gases. A power supply connection 20 electrically connects the fuel pump 16 to a vehicular fuel system. The fuel pump 16 includes a motor (not shown) having some form of commutator, a pump armature winding interfacing with the commutator, and a coil winding circuit. A fuel pump 16 according to the subject invention can be of any known type including, for example, that described in U.S. Pat. Nos. 7,523,745 and 7,411,326, both hereby incorporated by reference.

Figure 2:
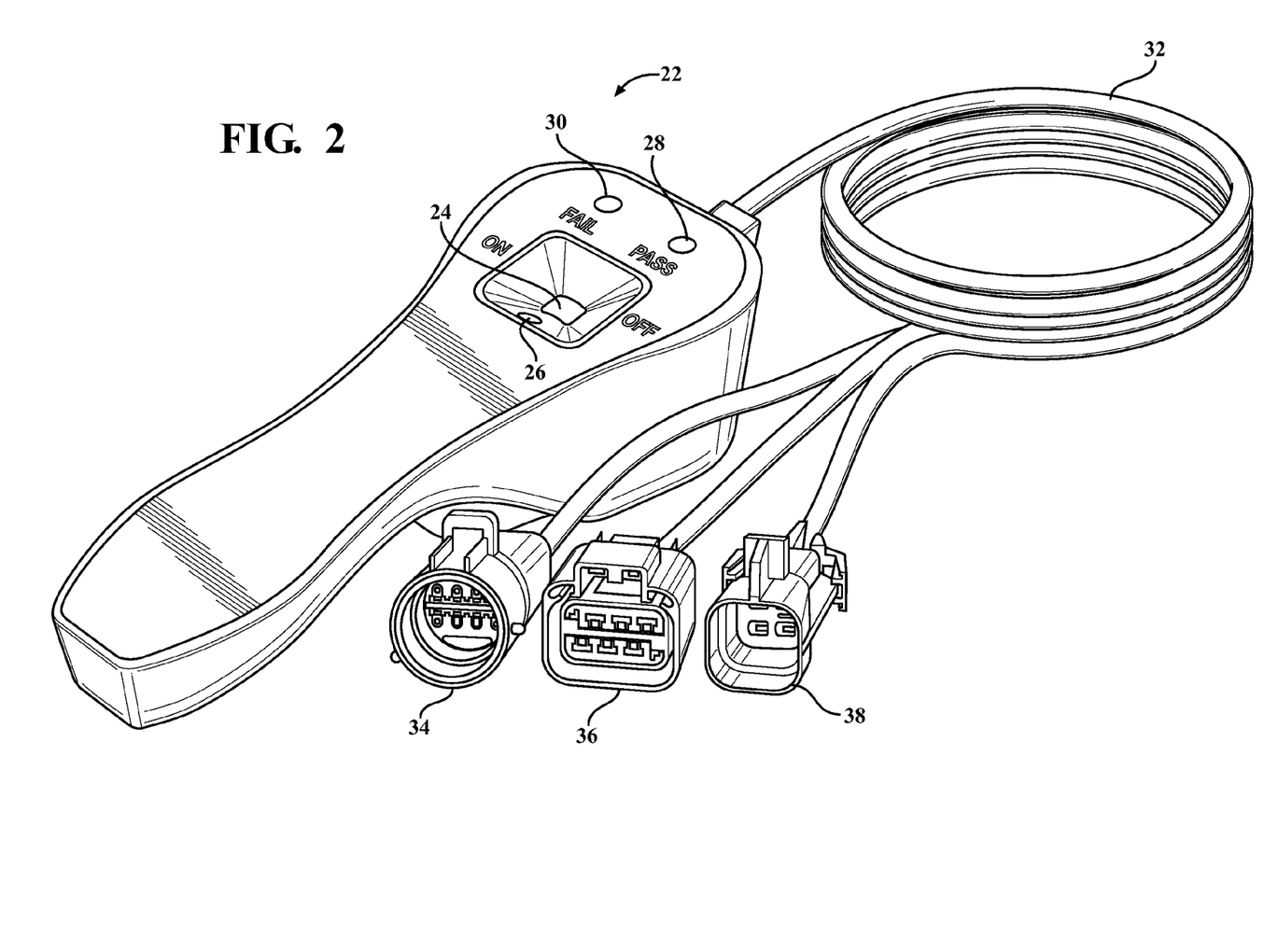
FIG. 2 is a perspective view of one embodiment of the present invention illustrating alternative connector fittings suitable for attachment to different makes of fuel pumps and/or fuel pump modules.
Figure 9:
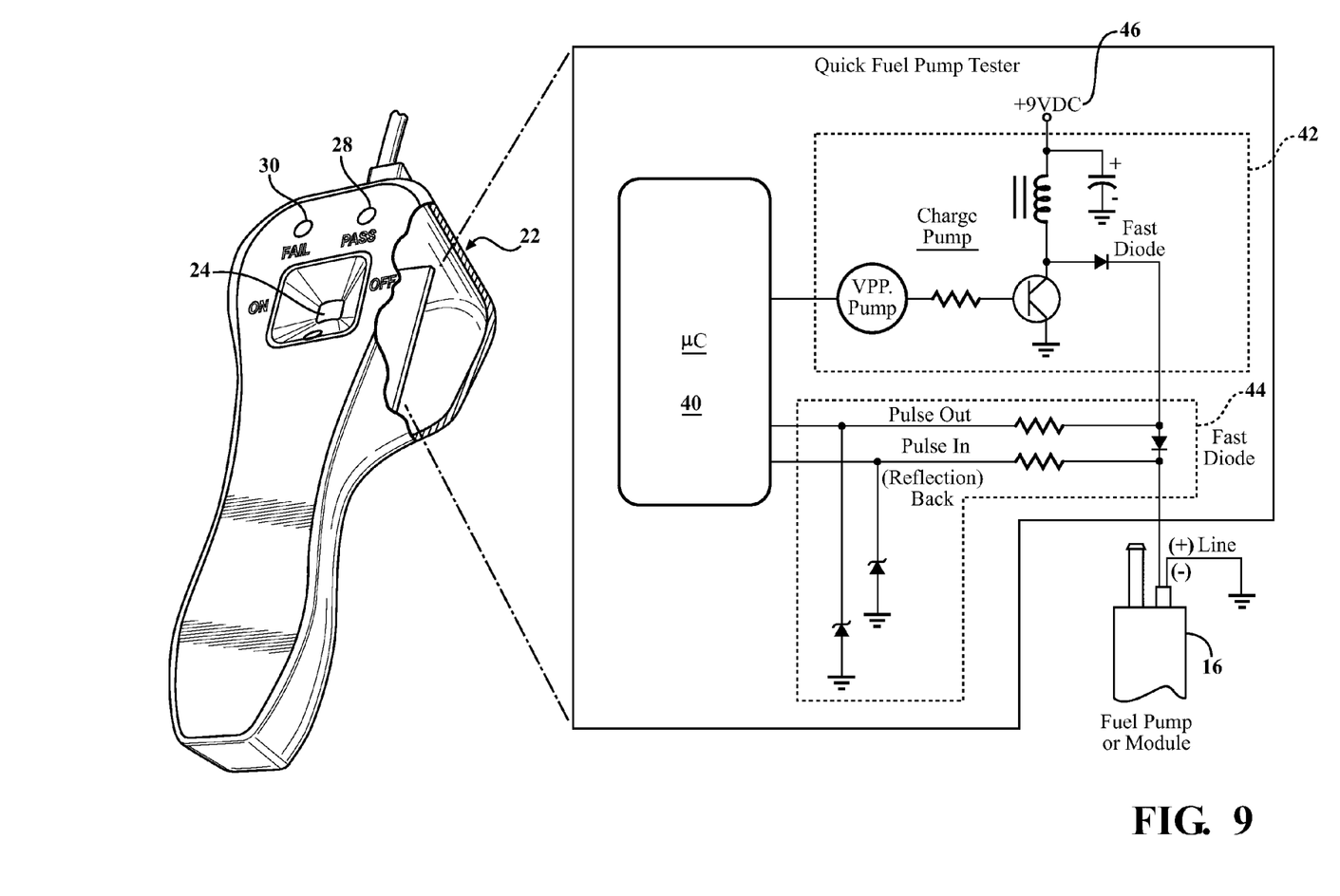
FIG. 9 depicts a simplified, exemplary circuit diagram for the present test apparatus.

A test apparatus according to one embodiment of the invention is generally shown at 22 in FIGS. 1 and 2. In this embodiment, the test apparatus 22 comprises a lightweight, handheld device ergonomically shaped and containing within its housing a non-transitory computer readable medium and a processor 40 (FIG. 9). The computer readable medium is preprogrammed with stored reference data relating to pump characteristics of functional units together with predetermined ranges or variances within which acceptable pump performance can be discerned. The test apparatus 22 preferably includes an On/Off switch 24 ergonomically located for actuation by a person's thumb. A Power On indicator light 26 may be included to identify when the device is powered on, as well as confirm that self contained batteries 46 (FIG. 9) carry a charge suitable for proper operation. PASS 28 and FAIL 30 indicator lights may be included. The PASS indicator light 28 may be designed to render a green colored light, whereas the FAIL indicator light 30 may be designed to render a red colored light. In addition or alternatively, audible, haptic or other forms of visual indicators can be used to distinguish between PASS and FAIL conditions.

Figure 4:
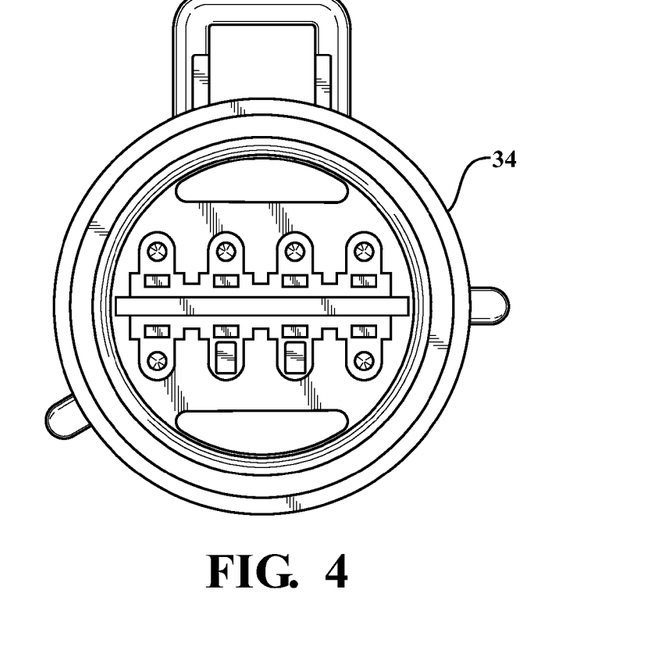
FIG. 4 is an end view of an exemplary first connector fitting for connecting to the power supply connection of a fuel pump originating from a first manufacturer.
Figure 5:
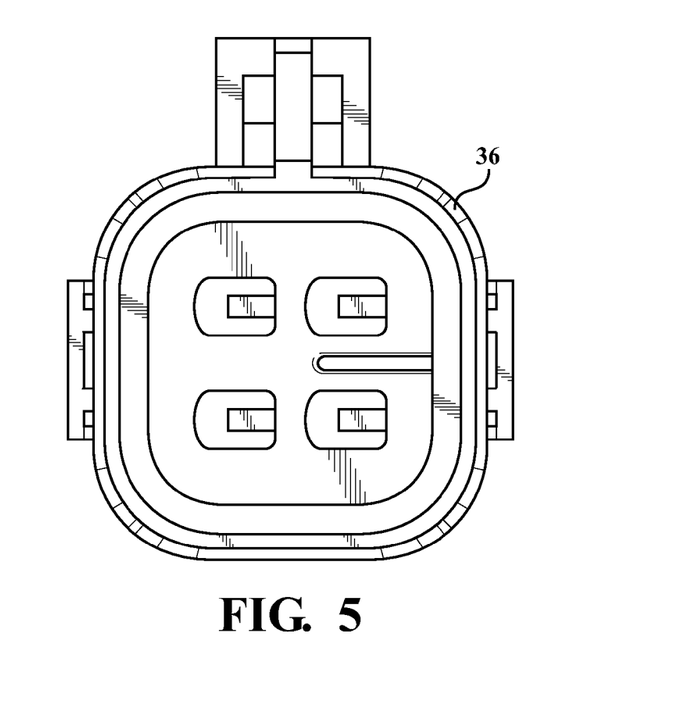
FIG. 5 is an end view of an exemplary second connector fitting for connecting to the power supply connection of a fuel pump originating from a second manufacturer.
Figure 6:
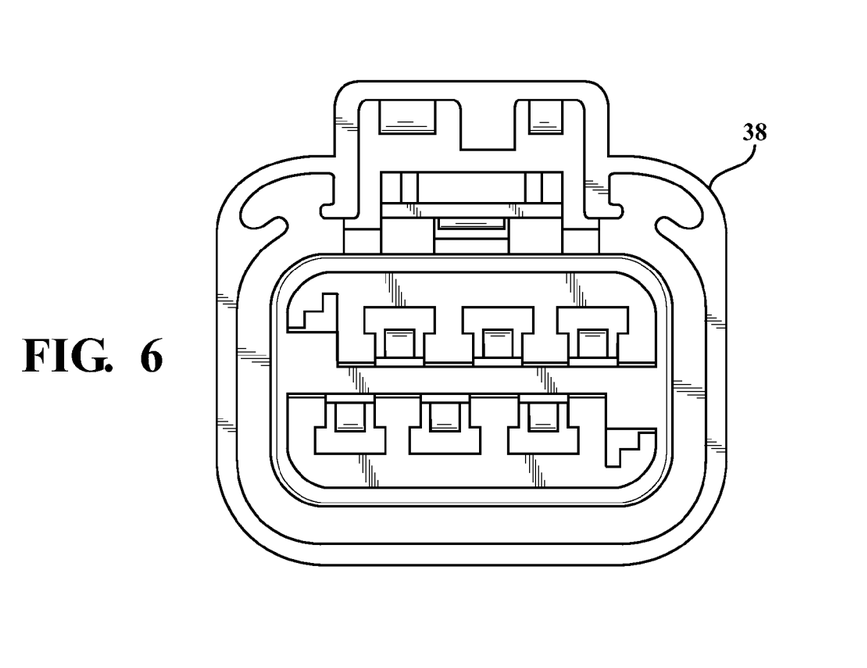
FIG. 6 is an end view of an exemplary third connector fitting for connecting to the power supply connection of a fuel pump originating from a third manufacturer.
Figure 7:
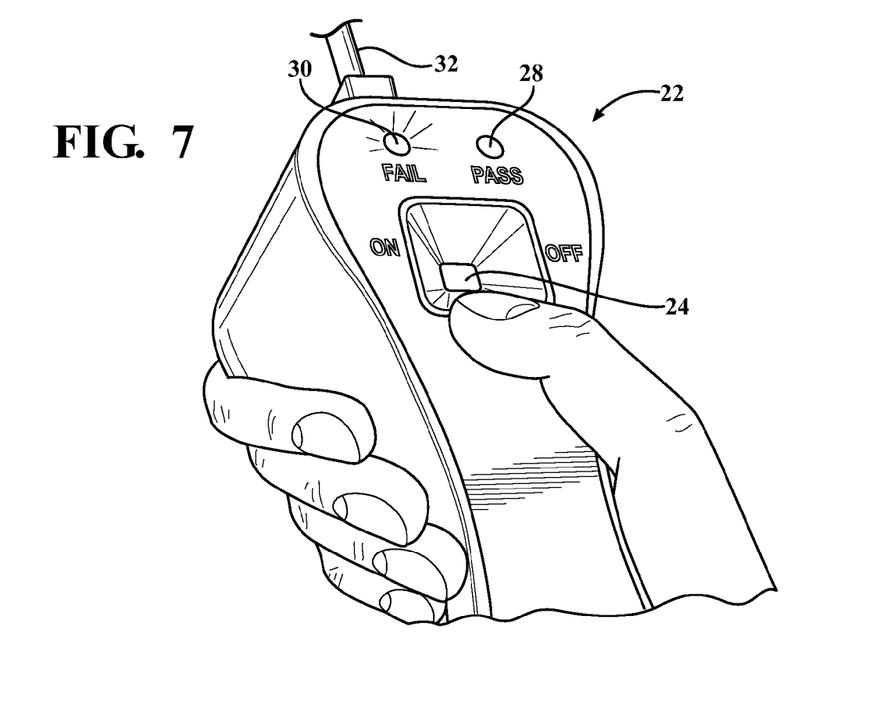
FIG. 7 is a fragmentary perspective view showing a technician holding a fuel pump tester according to one embodiment of the present invention which, during operation, generates a humanly discernable FAIL signal in the form of an illuminated indicator light

The test apparatus 22 further includes an extension cable 32 that may be sufficiently long enough to enable a technician to be stationed a comfortable distance away from the fuel pump 16. The extension cable 32 may, for example, be approximately 15 feet long, although other lengths are certainly within the scope and spirit of this invention. At the free distal end of the extension cable 32 (i.e., opposite the end adjoining the housing) are located at least one, and preferably multiple connector fittings 34, 36, 38. In the example shown in FIG. 3, three such connector fittings 34, 36, 38 are provided. Cable adaptor 34 may be suitable for connecting to a Ford style fuel pump 16, connector fitting 36 may be suitable for connection to a Chrysler style fuel pump 16 and connector fitting 38 may be configured to attach to a GM style fuel pump 16. These are of course examples only and the test apparatus 22 may be configured with additional, alternative or only one connector fitting. Alternatively, the connector fittings 34-38 may be disconnectable from the extension cable 32 and separately attached from an assortment made available to the technician via as common adaptor or quick-connect feature. FIGS. 4-6 illustrate the exemplary connector fittings 34, 36, 38 in greater detail.

Figure 3:
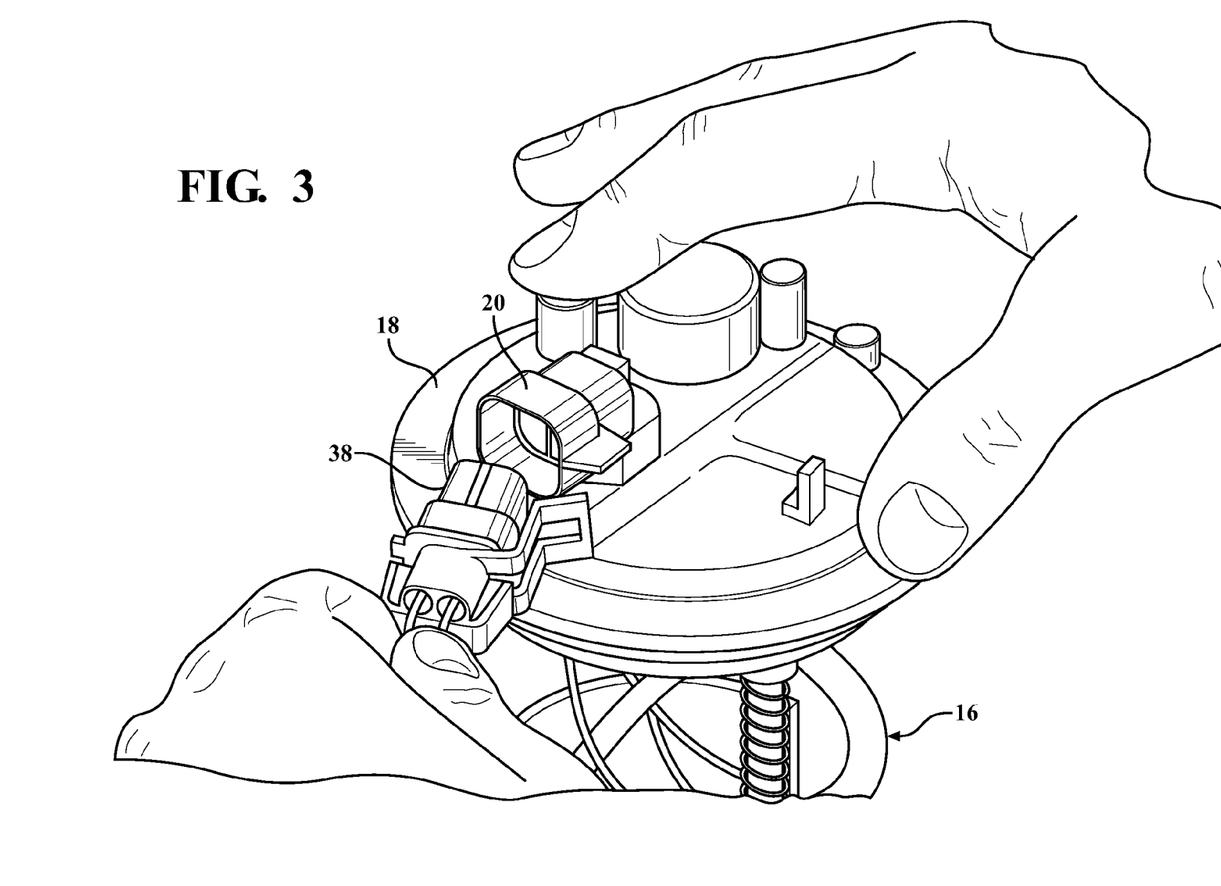
FIG. 3 is a fragmentary perspective view showing the hands of a technician electrically connecting the test apparatus to the power supply connection of a fuel pump.

In order to perform a vehicle fuel system test using the test apparatus 22, it may be necessary to first unplug or disconnect the power supply connection 20 from the vehicular fuel system prior to attaching the appropriate connector fitting 34-38 to electrically directly connect the test apparatus 22 to the fuel pump 16, as illustrated in FIG. 3. Once the test apparatus 22 is directly electrically connected to the fuel pump 16, the processor inside the handheld housing executes instructions coded on the non-transitory computer readable medium also contained in the housing. As mentioned previously, the test apparatus 22 preferably includes a self-contained electrical source which may be in the form of a rechargeable cell or replaceable batteries. In the example illustrated, the battery (ies) 46 may be located inside the housing to provide electrical power to operate the processor and carry out the other electronic functions.

The instructions coded on the non-transitory computer readable medium inside the test apparatus 22, and executed by the processor 40, perform a series of steps that conduct a rapid, preliminary test to determine if the fuel pump 16 is electrically and/or mechanically functioning properly. These steps include conducting a first test in which a low current signal (generated by the battery 46) is applied through the fuel pump power supply connection 20. The apparatus 22 then monitors for inductive reflectance from the pump armature winding in the fuel pump 16. Depending on the reflection quality returned to the test apparatus 22, it is possible to assess the working condition of this portion of the fuel pump 16. For example, if over a succession of rapid samplings the inductive reflectance does not change, it could indicate a fused or jammed pump armature. Data from the first test is collected in computer readable medium contained in the test apparatus 22.

A second test is also conducted by the apparatus 22. The second test is a continuity test in which a check is made for an open or shorted coil winding in the fuel pump 16. According to one approach, the tester 22 produces a small voltage sent through the cable 32 to the power supply connection 20, to determine whether current flows through the coil windings in the motor. Data from the second test is also collected in the test apparatus 22. The processor further executes instructions coded in the computer readable medium so as to conduct a third test with test apparatus 22. The third test applies a higher power, short duration pulse through the pump electrical connections 20 to create a rotational movement of the pump armature which is keyed to the pump's pumping section (not shown). This third test uses power supplied from the self-contained power source 46 (e.g., a single 9 VDC battery or three AAA cells) to detect both mechanical and electrical issues. Mechanical issues can include potentially locked pumping sections within the pump 16 and/or high frictional loads which may, for example, be caused by bad bearings or trapped debris. Electrical issues can include excessive current draw or alternatively low current draw. Data from the third test is collected in the test apparatus 22.

Preferably, although not necessarily, these first, second and third tests are repeated for each interface of the commutator and pump armature coil winding in the motor. In this way, each interface can be tested with the same first, second and third tests, with the data being collected as described in a computer readable medium within the hand-held unit. Once these tests are completed, the collected test data is compared to the stored reference data in the computer readable medium. Such comparisons preferably include reference to a pre-established threshold range within which the pump 16 will be deemed to pass or conform to acceptable standards. Outside the threshold range, however, the pump 16 will be deemed to fail or represent a potentially defective pump 16. In response to this comparison step, the processor executes additional instructions which generate either a FAIL or PASS signal which may be carried out through the indicator lights 28, 30 or by other suitable means.

Figure 8:
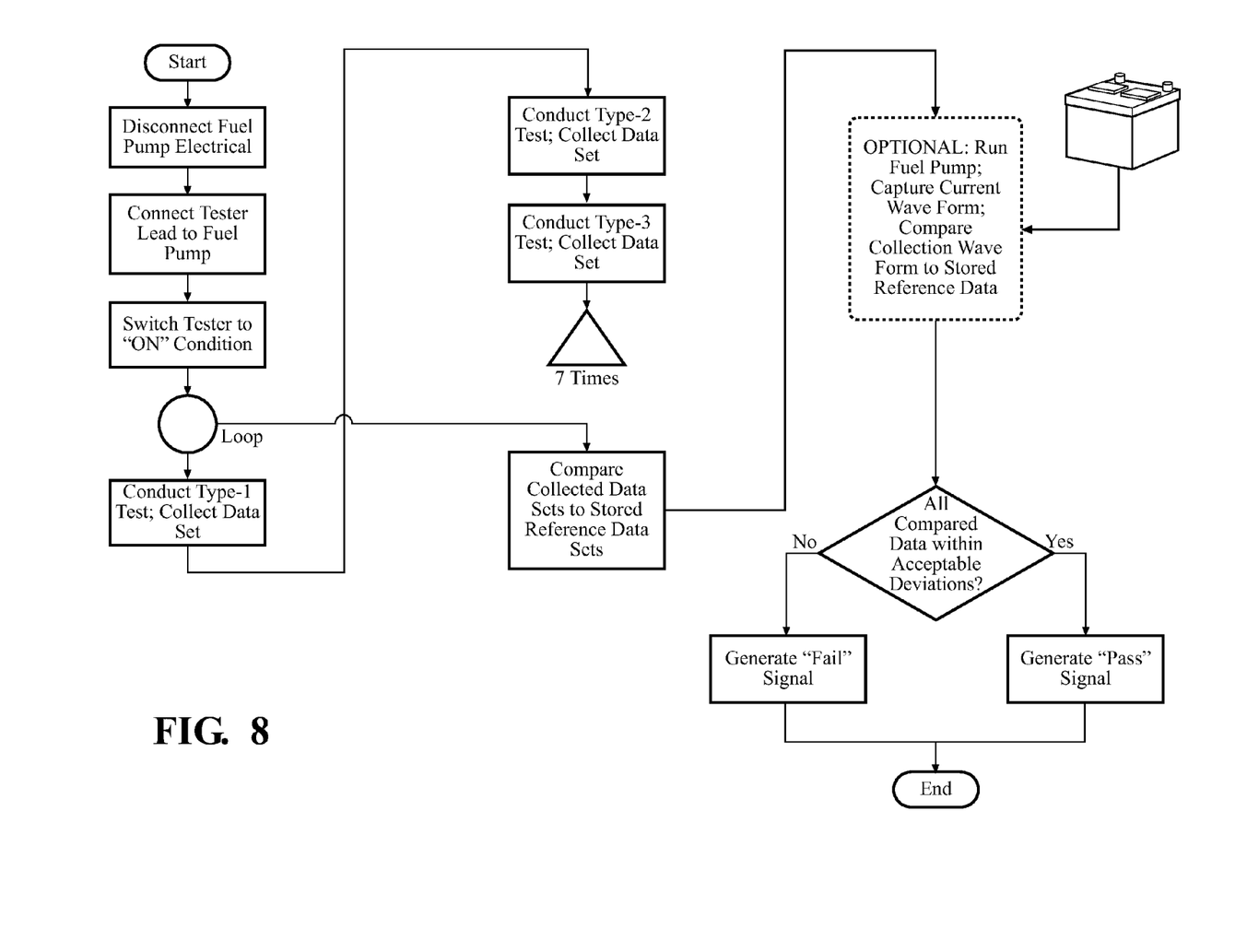
FIG. 8 is a flow chart depicting a method of testing the operation of an electric fuel pump according to one embodiment of the present invention.

A fourth, optional test may be carried out to provide additional information about the operating characteristics of the pump 16. This fourth test includes attaching the power supply connection 20 of the fuel pump 16 to a 12-volt DC power source such as the vehicle battery (or other power source suitable to run the pump 16). The fuel pump 16 is then energized via the power source (e.g., the vehicle battery) to operate the pump 16 under test, with a short run time current wave form being captured in the computer readable medium. This current wave form can likewise be compared to reference pump data sets as previously described and used as an indicator of its operation condition. FIG. 8 is a generalized flow diagram representing the operational steps as described above.

An electrical circuit configured to carry out the methods of this invention, according to one exemplary embodiment, is depicted in FIG. 9. In this example, a micro-controller includes a build-in processor 40 and is used to drive a charge pump circuit 42 as well as the base of a trace circuit 44. The micro-controller 40 is preferably a Digital Signal Processor. In this particular example, the charge pump circuit 42 is used to carry out the second (continuity) and third (mechanical & electrical issues) test, whereas the trace circuit 44 is used to carry out first (inductive reflectance) test. The battery 46 is here shown as a 9 VDC, which may be of the standard PP3 type commonly used in hand held electronic devices. Naturally, a electrical engineer of skill in the circuit designing arts will envision alternative circuit constructions that may be implemented to accomplish the methods of this invention. In other words, the specific circuit diagram in FIG. 9 is not intended to be limiting but rather exemplary in nature.

According to the methods described herein, the subject test apparatus 22 can be configured in the form of a hand-held, portable device that can be conveniently used by service technicians to perform a preliminary test of a fuel pump 16 in the field to determine if the fuel pump 16 is truly defective. The test apparatus 22 may take various physical forms not limited to those illustrated in the drawings. The apparatus 22 is connected directly to the fuel pump 16 and configured to perform at least two, and preferably three, and more preferably four, tests to determine pump electrical and mechanical integrity. The first test is carried out by applying a low voltage low current signal through the pump positive connection and then monitoring for an inductive reflectance from the pump armature winding. The second test comprises a continuity test through the pump electrical connections 20 to check for an open or shorted coil winding circuit that would not be absolutely detected in the first test. The third test is carried out by applying a higher power but short duration pulse through the pump electrical connection 20 to create some rotational movement of the pump armature keyed into the pumping section itself. This third test is configured to detect locked pumping sections (mechanical issue), high frictional load (mechanical issue), excessive current draw (electrical issue), low current draw (electrical issue), and possibly other issues. The first, second and third tests may be repeated to test each pump armature coil winding commutator interface. In addition, a short run period of the pump may be added which would require the test apparatus 22 to be attached to an external 12-volt DC battery to provide adequate power to run the pump 16 under test, thereby allowing the test apparatus 22 to capture a short run time current waveform. The apparatus 22 is programmed with reference pump data sets used to pass or fail pump functions that are checked during the separate tests. The subject test apparatus 22 thus checks pump 16 functionality in an unloaded condition and does not require testing the pump 16 with gasoline or a calibration fluid.

The present invention represents a unique and effective vehicle fuel pump 16 testing device 22 that is capable of applying a test load to a suspectedly failed pump 16 while checking for a combination of mechanical and electrical defects. The subject apparatus 22 benefits service technicians as well as manufacturers by providing a fast and simple diagnostic tool capable of checking fuel pump 16 integrity. Such a device 22 will help to reduce fuel pump warranty claims by allowing technicians and customers, part stores, counter personnel, professional mechanics and others to check fuel pump integrity and prevent good, functional fuel pumps from being claimed as defective.

The foregoing invention has been described in accordance with the relevant legal standards, thus the description is exemplary rather than limiting in nature. Variations and modifications to the disclosed embodiment may become apparent to those skilled in the art and fall within the scope of the invention.

What is claimed is:

1. A method for fault detecting in electric components located in vehicle circuits, and more particularly for testing the operation of an electric fuel pump, comprising the steps of:

providing an electric fuel pump having a power supply connection for electrically connecting the fuel pump to a vehicular fuel system, the fuel pump including a motor having a commutator, a pump armature winding interfacing with the commutator, and a coil winding circuit;

providing a test apparatus having a processor and a non-transitory computer readable medium; storing reference data in the non-transitory computer readable medium;

electrically connecting the test apparatus to the power supply connection of the fuel pump;

the non-transitory computer readable medium coded with instructions and executed by the processor to perform the steps of:

conducting a first test with the test apparatus, the first test including applying a low current signal through the fuel pump power supply connection and monitoring for inductive reflectance from the pump armature winding in the fuel pump;

collecting data from the first test in the non-transitory computer readable medium in the test apparatus;

conducting a second continuity test with the test apparatus, the second test including checking for an open or shorted coil winding circuit in the fuel pump;

collecting data from the second test in the non-transitory computer readable medium in the test apparatus;
comparing the collected test data to the stored reference data; and
generating either a humanly discernable FAIL or PASS signal in response to said comparing step.

2. The method of claim 1, including the step of disconnecting the power supply connection from a vehicular fuel system prior to said step of conducting a first test.

3. The method of claim 1, further including the step of conducting a third test with the test apparatus, the third test including applying a higher power, short duration pulse through the pump electrical connections to create a rotational movement of the pump armature which is keyed to the pumping section, and collecting data from the third test in the non-transitory computer readable medium in the test apparatus.

4. The method of claim 3, wherein said step of conducting a third test includes detecting a mechanical issue.

5. The method of claim 4, wherein said step of detecting a mechanical issue includes detecting a locked pumping section.

6. The method of claim 4, wherein said step of detecting a mechanical issue includes detecting a high frictional load.

7. The method of claim 3, wherein said step of conducting a third test includes detecting an electrical issue.

8. The method of claim 7, wherein said step of detecting an electrical issue includes detecting excessive current draw.

9. The method of claim 7, wherein said step of detecting an electrical issue includes detecting low current draw.

10. The method of claim 3, further including the step of repeating the first, second and third tests to test each pump armature coil winding commutator interface.

11. The method of claim 1, further including the step of repeating the first and second tests to test each pump armature coil winding commutator interface.

12. The method of claim 1, further including attaching the power supply connection of the fuel pump to a 12 VDC power source, energizing the fuel pump via the power source to operate the pump under test, and capturing a short runtime current waveform.

13. The method of claim 1, wherein said step of generating a FAIL or PASS signal includes generating a PASS signal if the collected test data is within a predetermined range of proximity to the stored reference data.

14. The method of claim 13, wherein said step of generating a FAIL signal includes illuminating a red light.

15. The method of claim 13, wherein said step of generating a PASS signal includes illuminating a green light.

16. A method for fault detecting in electric components located in vehicle circuits, and more particularly for testing the operation of an electric fuel pump, comprising the steps of:
providing an electric fuel pump having a power supply connection for electrically connecting the fuel pump to a vehicular fuel system, the fuel pump including a motor having a commutator, a pump armature winding interfacing with the commutator, and a coil winding circuit;
disconnecting the power supply connection from a vehicular fuel system;
providing a test apparatus having a non-transitory computer readable medium and a processor; storing reference data in the non-transitory computer readable medium in the test apparatus;
electrically directly connecting the test apparatus to the power supply connection of the fuel pump;
the non-transitory computer readable medium coded with instructions and executed by the processor to perform the steps of:
conducting a first test with the test apparatus, the first test including applying a low current signal through the fuel pump power supply connection and monitoring for inductive reflectance from the pump armature winding in the fuel pump;
collecting data from the first test in the non-transitory computer readable medium;
conducting a second continuity test with the test apparatus, the second test including checking for an open or shorted coil winding circuit in the fuel pump;
collecting data from the second test in the non-transitory computer readable medium;
conducting a third test with the test apparatus, the third test including applying a higher power, short duration pulse through the pump electrical connections to create a rotational movement of the pump armature which is keyed to the pumping section;
collecting data from the third test in the non-transitory computer readable medium;
repeating the first and second tests to test each pump armature coil winding commutator interface;
comparing the collected test data to the stored reference data in the test apparatus; and
generating either a FAIL or PASS signal at the test apparatus in response to said comparing step.

17. The method of claim 16, further including attaching the power supply connection of the fuel pump to a 12 VDC power source, energizing the fuel pump via the power source to operate the pump under test, and capturing a short runtime current waveform.

18. A test apparatus (22) for fault detecting an electrically connected electric fuel pump, said apparatus (22) comprising:
a hand-held housing;
a non-transitory computer readable medium disposed in said housing;
a processor disposed in said housing and operatively associated with said computer readable medium;
an extension cable (32) adjoining said housing at one end thereof and having a free distal end;
at least one connector fitting (34, 36, 38) disposed on said free distal end of said extension cable (32), said connector fitting (34, 36, 38) configured for electrically connecting to the power supply connection of an electric fuel pump to be tested;
at least one indicator feature (28, 30) supported on said housing;
said non-transitory computer readable medium coded with instructions and executed by said processor to perform the steps of:
conducting a first test, the first test including applying a low current signal through said connector fitting (34, 36, 38) and into the fuel pump power supply connection and monitoring for inductive reflectance from a pump armature winding in the fuel pump;
collecting data from the first test;
conducting a second continuity test, the second test including checking for an open or shorted coil winding circuit in the fuel pump;
collecting data from the second test;
conducting a third test, the third test including applying a higher power, short duration pulse through said connector fitting (34, 36, 38) to create a rotational movement of the pump armature;

collecting data from the third test;

comparing the collected test data to stored reference data; and generating either a FAIL or PASS signal at said indicator feature (28, 30) in response to the comparing step.

19. The apparatus of claim 18, wherein said at least one connector fitting (34, 36, 38) comprises a plurality of alternative connector fittings (34, 36, 38) disposed on said free distal end of said extension cable (32).

20. The apparatus of claim 18, wherein said at least one indicator feature (28, 30) includes at least two lights (28, 30) having different colors when illuminated.

* * * * *